(12) United States Patent
Huang

(10) Patent No.: US 12,463,141 B2
(45) Date of Patent: Nov. 4, 2025

(54) SEMICONDUCTOR SUBSTRATE, SEMICONDUCTOR PACKAGE, METHOD OF MANUFACTURING THE SAME

(71) Applicant: Advanced Semiconductor Engineering, Inc., Kaohsiung (TW)

(72) Inventor: Wen Hung Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 675 days.

(21) Appl. No.: 16/694,857

(22) Filed: Nov. 25, 2019

(65) Prior Publication Data

US 2021/0159181 A1     May 27, 2021

(51) Int. Cl.
    *H01L 23/538*     (2006.01)
    *H01L 23/522*     (2006.01)

(52) U.S. Cl.
    CPC ...... *H01L 23/5389* (2013.01); *H01L 23/5222* (2013.01); *H01L 23/5228* (2013.01); *H01L 23/5383* (2013.01)

(58) Field of Classification Search
CPC ............ H01L 23/5389; H01L 23/5222; H01L 23/5228; H01L 23/5383; H01L 23/145; H01L 24/96; H01L 24/20; H01L 24/25; H01L 24/19; H01L 2924/181; H01L 2224/16227; H01L 2924/1433; H01L 2924/14; H01L 2224/16225; H01L 24/16; H01L 2224/2518; H01L 2924/15313; H01L 2924/00012
USPC ......................................................... 257/773
See application file for complete search history.

(56) References Cited

U.S. PATENT DOCUMENTS

| | | | |
|---|---|---|---|
| 6,713,860 B2 | 3/2004 | Li | |
| 7,864,542 B2 | 1/2011 | Inagaki et al. | |
| 10,756,054 B1 * | 8/2020 | Huang | ............... H01L 21/568 |
| 2020/0350254 A1 | 11/2020 | Huang | |

OTHER PUBLICATIONS

Comprehensive Dictionary of EE, by LaPLante. 2000. Defining Substrate. 2000.*
Etymology on Line Defining Substrate. No Date.*

* cited by examiner

*Primary Examiner* — Nathan W Ha
(74) *Attorney, Agent, or Firm* — FOLEY & LARDNER LLP

(57) ABSTRACT

A semiconductor substrate includes a substrate and a plurality of electronic components. The substrate defines a cavity. A total number of the electronic components is N, the electronic components are divided into M groups, M and N are positive integers, and M is smaller than N. The electronic components in each group are encapsulated by a first insulation layer to form a respective component module. Each of the component modules is disposed in the cavity. A second insulation layer fills the cavity and encapsulates the component modules.

15 Claims, 13 Drawing Sheets

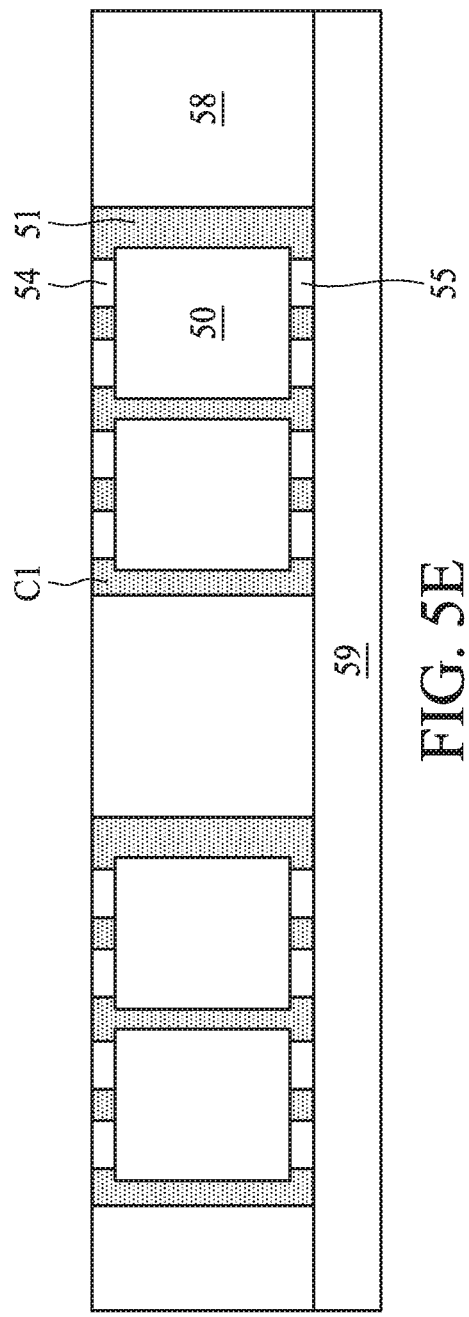
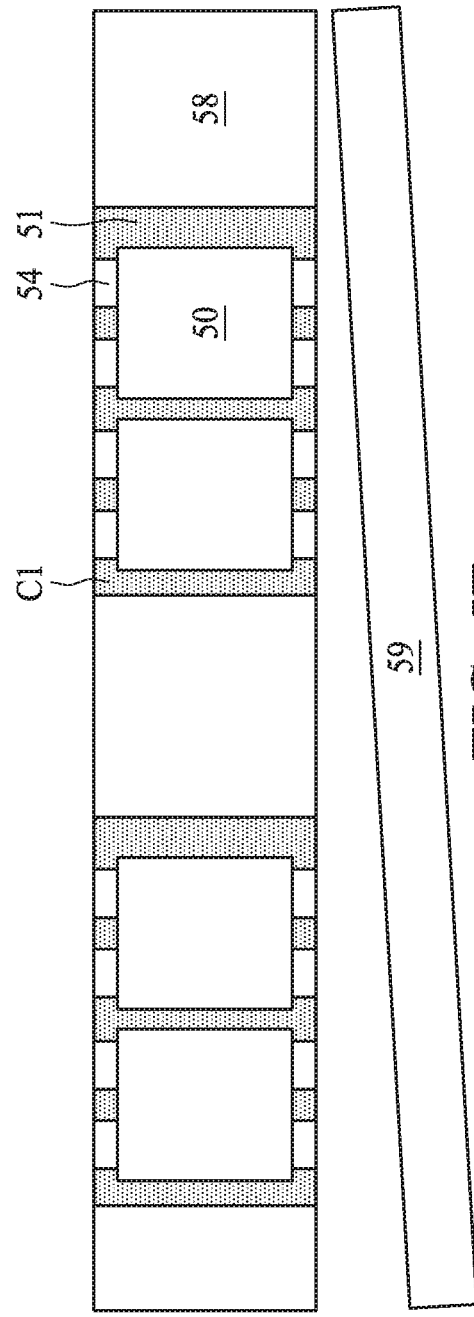

SEMICONDUCTOR SUBSTRATE, SEMICONDUCTOR PACKAGE, METHOD OF MANUFACTURING THE SAME

BACKGROUND

1. Field of the Disclosure

The present disclosure relates to semiconductor substrates and semiconductor packages and methods of manufacturing the same.

2. Description of Related Art

Recently more and more electronic components are embedded within a cavity of a substrate to form a semiconductor device package. An insulation material fills into the cavity to encapsulate the electronic components. However, the position of the electronic components may be shifted during the filling of the insulation material, which adversely affects reliability or performance of the semiconductor device package.

SUMMARY

According to some embodiments of the present disclosure, a semiconductor substrate includes a substrate and a plurality of electronic components. The substrate defines a cavity. A total number of the electronic components is N, the electronic components are divided into M groups, M and N are positive integers, and M is smaller than N. The electronic components in each group are encapsulated by a first insulation layer to form a respective component module. Each of the component modules is disposed in the cavity. A second insulation layer fills the cavity and encapsulates the component modules.

According to some embodiments of the present disclosure, a semiconductor package includes a substrate and a plurality of component modules. The substrate defines a cavity. The component modules are disposed in the cavity. A plurality of first electronic components are distributed in the component modules. Each of the component modules includes a first insulation layer. The first insulation layer encapsulates the first electronic components distributed in the component module. A total number of the first electronic components is N, a total number of the component modules is M, M and N are positive integers, and M is smaller than N. The semiconductor package further includes a second insulation layer, a first redistribution layer (RDL) structure and a second electronic component. The second insulation layer fills the cavity and encapsulates the component modules. The first RDL structure is disposed on a top surface of the substrate. The second electronic component is disposed on a top surface of the first RDL structure.

According to some embodiments of the present disclosure, a method of manufacturing a semiconductor substrate includes: (a) providing a substrate defining a cavity; (b) providing a plurality of component modules; (c) disposing the component modules in the cavity of the substrate; (d) forming an insulation layer in the cavity to encapsulate the component modules. A plurality of electronic components are distributed in the component modules. Each of the component modules comprises an insulation layer encapsulating the electronic components distributed in the component module. A total number of the electronic components is N, a total number of the component modules is M, M and N are positive integers, and M is smaller than N.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

FIG. 5A, FIG. 5B, FIG. 5C, FIG. 5D, FIG. 5E, FIG. 5F, FIG. 5G, FIG. 5H and FIG. 5I illustrate various stages of a method for manufacturing a component module in accordance with some embodiments of the present disclosure.

Figure 1:
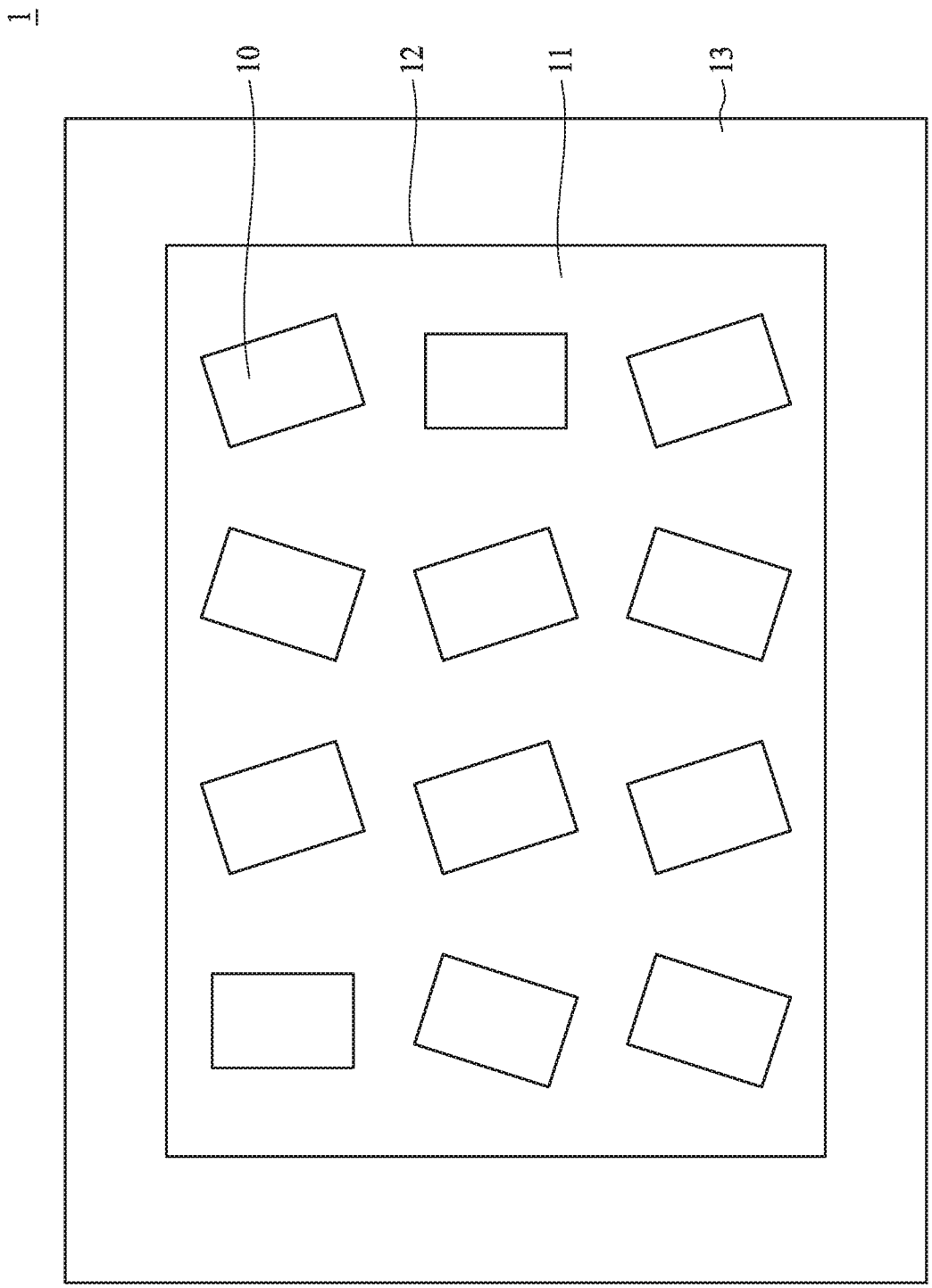
FIG. 1 is a top view of a semiconductor substrate including a plurality of electronic components in accordance with comparative embodiments.

Common reference numerals are used throughout the drawings and the detailed description to indicate the same or similar components. The present disclosure will be more apparent from the following detailed description taken in conjunction with the accompanying drawings.

DETAILED DESCRIPTION

The following disclosure provides for many different embodiments, or examples, for implementing different features of the provided subject matter. Specific examples of components and arrangements are described below. These are, of course, merely examples and are not intended to be limiting. In the present disclosure, reference to the formation or disposal of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1 is a top view of a semiconductor substrate 1 including a plurality of electronic components 10 embedded therein in accordance with comparative embodiments. As shown in FIG. 1, a substrate 13 defines a cavity 12 for accommodating electronic components 10. In a method for manufacturing the semiconductor substrate 1, the substrate 13 is placed onto an adhesive tape, each of the electronic components 10 is independently disposed in the cavity 12 of the substrate 13 and attached on the adhesive tape using a pick-and-place machine, and then an insulation material 11 fills the cavity 12 of the substrate 13 to encapsulate and fix the electronic components 10. With the increase in the number of the electronic components 10, the yield of the semiconductor substrate greatly decreases. For example, the yield may decrease from 99.5% to 78.62% when the number of the electronic components increases from 1 to 48 (0.995^48=0.7862). In addition, the position of the electronic components attached on the adhesive tape may shift during the operation of filling the insulation material into the cavity which affects the accuracy of electrical connection to be made in subsequent processes and thus the yield become worse. It is therefore desirable to manufacture a semiconductor substrate including a plurality of embedded electronic components with an improved yield and less position shift of electronic components.

The present disclosure describes techniques suitable for the manufacture of a semiconductor substrate including a plurality of embedded electronic components with an improved yield and less position shift of electronic components. In the embodiments in accordance with the present disclosure, the electronic components are divided into several groups, each group of the electronic components are included in a preformed component module. By placing the preformed component modules, rather than each of individual electronic components, into the cavity of the substrate, the yield of the semiconductor substrate can be significantly improved and the position shift of embedded electronic components can be also improved.

Figure 2:
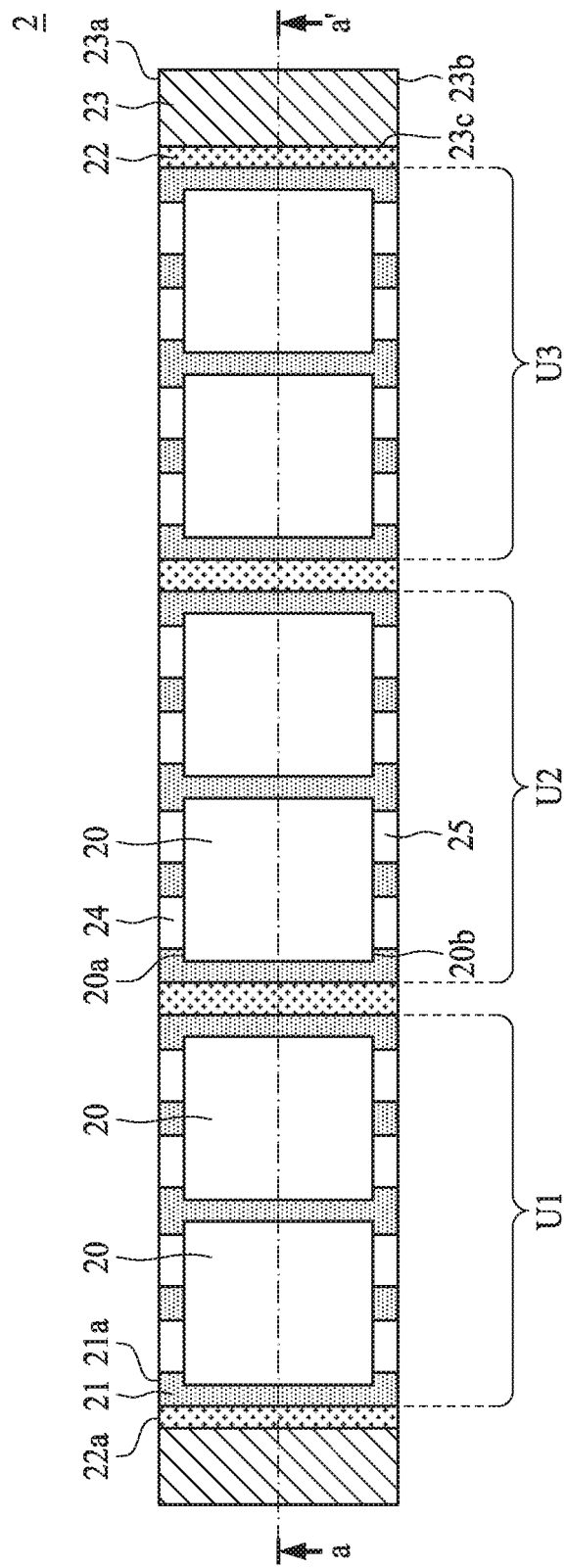
FIG. 2 is a cross-sectional view of a semiconductor substrate in accordance with some embodiments of the present disclosure.

FIG. 2 is a cross-sectional view of a semiconductor substrate in accordance with some embodiments of the present disclosure.

The semiconductor substrate 2 of FIG. 2 includes a substrate 23 and a plurality of electronic components 20. The substrate 23 defines a cavity 23c for accommodating the plurality of electronic components. A total number of the electronic components 20 is N, the electronic components are divided into M groups, M and N are positive integers, and M is smaller than N. The electronic components 20 in each group are encapsulated by a first insulation layer 21 to form a respective component module U1, U2, U3. Each of the component modules is disposed in the cavity 23c. A second insulation layer 22 fills the cavity 23c and encapsulates the component modules U1, U2 and U3.

In some embodiments, the substrate 23 includes a core substrate, which may be, or may include, a polymeric or a non-polymeric material. For example, the core substrate may include, without limitation to, C-stage resin materials, such as Ajinomoto build-up film (ABF), bismaleimide triazine (BT) resin, polyimide, or the like, or other suitable materials. In some embodiments, a resin material used in the core substrate may be a fiber-reinforced resin so as to strengthen the core substrate, and the reinforcing fibers may be, without limitation to, glass fibers or Kevlar fibers (aramid fibers).

The electronic components 20 include a passive component, active component or both. In some embodiments, the electronic components include one or more passive components, e.g., a capacitor, a resistor, an inductor or other suitable passive components.

In the embodiments in accordance with the present disclosure, the N electronic components are divided into M groups, each group of the electronic components are included in a component module. The yield Y' of the semiconductor substrate may be calculated by the following equation:

$$Y'=Y(N/M) \times Y(M) \quad (1)$$

where Y is the yield of attachment of a single electronic component. The value of Y may vary depending on the type of the pick-and-place machine, the type of an adhesive tape, and other factors. In some embodiments, Y is approximately 99.5%.

By placing the component modules, rather than each of individual electronic components, into the cavity of the substrate, the yield of the semiconductor substrate can be improved. For example, when the total number N of the electronic components is 120 and the yield of attachment of a single electronic component is 99.5%, the yield Y' of the semiconductor substrate can increase from 54.80% to 73.29%, 80.6% or 90% when zero, two, three or twelve component modules are used. In addition, since the electronic components are distributed in several component modules, the function of the electronic components in each component module can be tested before placing the component module into the cavity of the substrate, which can further improve the quality of the semiconductor substrate.

In some embodiments, the total number N of the electronic components 20 is equal to greater than 20 (e.g., N≥20), and in these embodiments, by selecting a suitable value for M, the yield Y' of the semiconductor substrate can be in a range which is beneficial to massive production.

In some embodiments, M (e.g, the number of the groups or the number of the component modules) is in the following range: 5≤M≤10.

In some embodiments, when N is given, an optimum value of M can be determined by the maximum of Y', e.g., by the following equation:

$$Y'_{max}=\text{Max}\{Y(N/M) \times Y(M)\} \quad (2).$$

In some embodiments, the first insulation layer 21 is made of a same material from which the second insulation layer 22 are made. In some embodiments, the first insulation layer 21 and the second insulation layer 22 is made of is made of a different material from which the second insulation layer are made. The first insulation layer 21 or the second insulation layer 22 may be made of a polymeric or a non-polymeric dielectric material. For example, the first insulation layer 21 or the second insulation layer 22 may include a flowable dielectric material in a hardened or semi-hardened state, such as a liquid crystal polymer, a resin with pre-impregnated fibers (e.g., a prepreg), Ajinomoto Buildup Film (ABF), a resin, an epoxy material, or other flowable dielectric material in a hardened or semi-hardened state.

In some embodiments, one or more of the electronic components 20 include an electrical contact pad 24 on a top surface 20a of the electronic components 20. In some embodiments, one or more of the electronic components 20 include an electrical contact pad 25 on a bottom surface 20b of the electronic components 20. In some embodiments, one or more of the electronic components 20 include both an electrical contact pad 24 on the top surface 20a and an electrical contact pad 25 on the bottom surface 20b.

In some embodiments, a top surface 21a of the first insulation layer 21 is at a first height, a top surface 22a of the second insulation layer 22 is at a second height, and the first height is substantially the same as or lower than the second height. In some embodiments, the first height of the first insulation layer 21 is lower than the second height of the second insulation layer 22 and the second insulation layer 22 covers the top surface 21a of the first insulation layer 21. In some embodiments, the electrical contact pad 24 on the top surface 20a of the electronic components 20 are exposed from the first insulation layer 21 or the second insulation layer 22 for electrically connecting to a circuit or electronic component disposed over the electronic components 20 (not shown in FIG. 2). In some embodiments, the electrical contact pad 25 on the bottom surface 20b of the electronic components 20 are exposed from the first insulation layer 21 or the second insulation layer 22 for electrically connecting to a circuit or electronic component disposed below the electronic components 20 (not shown in FIG. 2).

Figure 3:
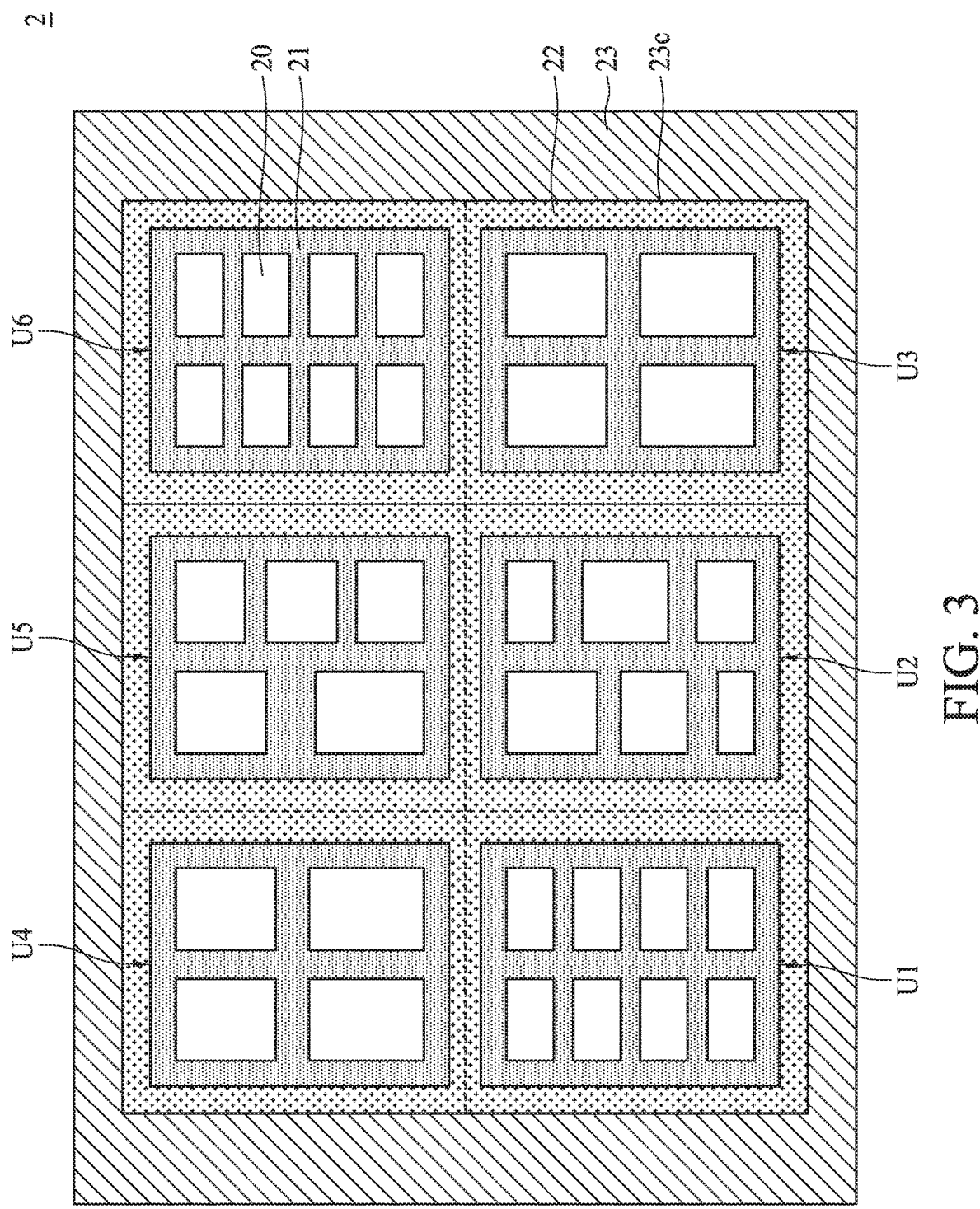
FIG. 3 is a cross-sectional view of a semiconductor substrate in accordance with some embodiments of the present disclosure.

FIG. 3 is a cross-sectional view of the semiconductor substrate 2 taken along line a-a' of FIG. 1. As shown in FIG. 3, the substrate 23 defines one or more cavities 23c for accommodating a plurality of electronic components 20. The cavity 23c may have any suitable shape, e.g., rectangular shape, L-shape or other suitable shapes. The electronic components 20 are divided into M groups and the electronic components 20 in each group are encapsulated by a first insulation layer 21 to form a respective component module. Each group may include one or more of electronic components, for example, 1, 2, 3, 4, 5, 6, 8, 10, 12, 14, 16, 18, 20 or more electronic components. The electronic components may have a different shape or size from each other and may be arranged regularly or randomly in the component module.

In the embodiments illustrated in FIG. 3, the cavity 23c includes six component modules U1, U2, U3, U4, U5 and U6. In some embodiments, the substrate 23 defines one or more cavities and one or more of the component modules U1, U2, U3, U4, U5 and U6 may be distributed in a same cavity or in different cavities. In some embodiments, the cavity 23c may include one ore more component modules, for example, 1, 2, 3, 4, 5, 6, 8, 10, 12, 14, 16, 18, 20 or more component modules which are arranged regularly or randomly in the cavity 23c. By placing the component modules, rather than each of individual electronic components, into the cavity of the substrate, the size of the cavity is adjustable and may be larger than that the size restricted by the existing equipments. In addition, as compared to filling an insulation material into the cavity to encapsulate all of the electronic components, since in the embodiments in accordance with the present disclosure the electronic components are distributed in several component modules in the cavity, the warpage of the semiconductor substrate can be reduced.

In some embodiments, the electronic components in a same component module may have the same or similar electrical characteristics. In some embodiments, the electronic components in adjacent component modules may have the same or similar electrical characteristics. For example, capacitors may be arranged in one component module or adjacent component modules while inductors may be arranged in other component module or other adjacent component modules. Therefore, the semiconductor package can be designed depending on the characteristics of the electronic components contained in the component module or adjacent component modules to provide a better protection to the electronic components.

Figure 4:
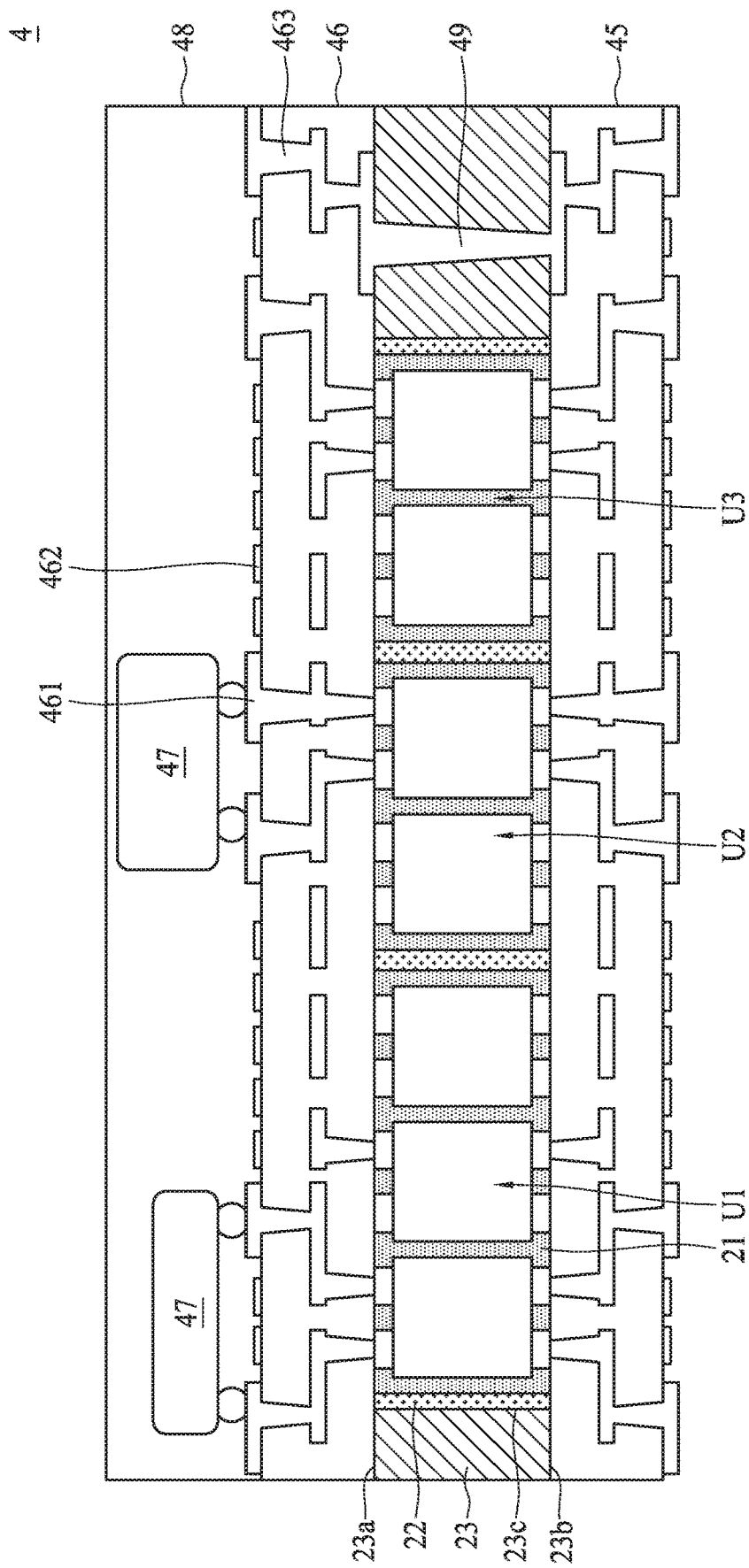
FIG. 4 is a cross-sectional view of a semiconductor package in accordance with some embodiments of the present disclosure.

FIG. 4 is a cross-sectional view of a semiconductor package 4 in accordance with some embodiments of the present disclosure.

As shown in FIG. 4, the semiconductor package 4 includes a substrate 23 and a plurality of component modules U1, U2 and U3. The substrate 23 defines a cavity 23c. The component modules U1, U2 and U3 are disposed in the cavity 23c. A plurality of first electronic components 20 are distributed in the component modules U1, U2 and U3. Each of the component modules U1, U2 and U3 includes a first insulation layer 21. The first insulation layer 21 encapsulates the first electronic components distributed in the component module. The semiconductor package 4 further includes a second insulation layer 22 filling the cavity 23c and encapsulating the component modules U1, U2 and U3. The details of the substrate 23, the component modules U1, U2 and U3, the first insulation layer 21, the second insulation layer 22, and the first electronic components 20 have been discussed above with respect to the embodiments illustrated in FIG. 2 and FIG. 3.

In some embodiments, the semiconductor package 4 may include a first RDL structure 46 disposed on a top surface 23a of the substrate 23. In some embodiments, the semiconductor package 4 may include a second RDL structure 45 disposed on a bottom surface 23b of the substrate 23. The first RDL structure 46 and the second RDL structure 45 may include one or more redistribution layers and insulation material(s) or dielectric material(s) (not denoted in FIG. 4) encapsulating the one or more redistribution layers. The insulation material(s) or dielectric material(s) may include organic material, solder mask, polyimide (PI), epoxy, Ajinomoto build-up film (ABF), molding compound, or a combination of two or more thereof. The first RDL structure 46 and the second RDL structure 45 may include conductive trace(s) 462, pad(s) 461, contact(s), via(s) 463 to electrically connect the one or more redistribution layers with each other, or electrically connect the first or second RDL structure to the electronic components 20 embedded in the substrate 23, or electrically connect the first or second RDL structure to an external circuit or electronic component (e.g., a second electronic component 47).

In some embodiments, the semiconductor package 4 may include one or more second electronic components 47 disposed on a top surface of the first RDL structure 46. The second electronic components may include, for example, but is not limited to, an active component, e.g., a processor component, a switch component, an application specific IC (ASIC) or another active component.

In some embodiments, the semiconductor package 4 may include an encapsulant 48 covering the top surface of the first RDL structure 46 and the second electronic component 47. The encapsulant 48 may include insulation or dielectric material. In some embodiment, the encapsulant 48 be made of molding material that may include, for example, a Novolac-based resin, an epoxy-based resin, a silicone-based resin, or other another suitable encapsulant. Suitable fillers may also be included, such as powdered $SiO_2$.

In some embodiments, the semiconductor package 4 may further include a conductive member 49 penetrating through the substrate 23 and electrically connected to the circuit or electronic component disposed on the top surface of the substrate or the bottom surface of the substrate. In some embodiments as illustrated in FIG. 4, the conductive member 49 is electrically connected to the first RDL structure 46 and the second RDL structure 47.

The semiconductor package 4 may provide various functions depending on the electronic components contained in the package. In some embodiments, the semiconductor package 4 can be, for example, a power integration package having a plurality of passive components embedded in the core substrate.

FIG. 5A, FIG. 5B, FIG. 5C, FIG. 5D, FIG. 5E, FIG. 5F, FIG. 5G, FIG. 5H and FIG. 5I illustrate various stages of a method for manufacturing a component module in accordance with some embodiments of the present disclosure.

Figure 5A:
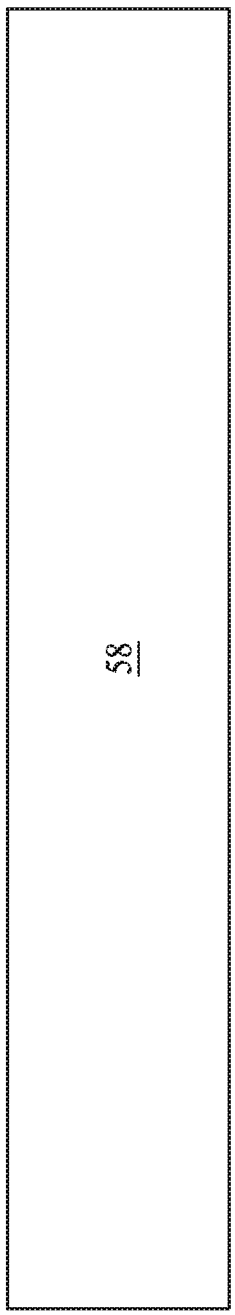
Figure 5B:
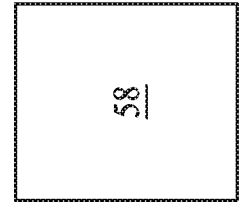
Figure 5B:
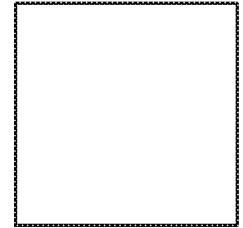
Figure 5B:
Figure 5C:
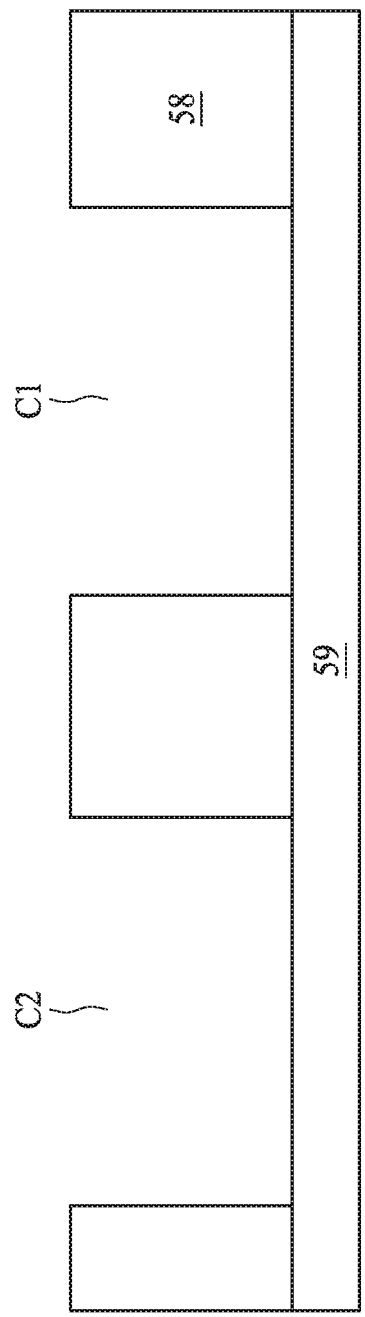

Referring to FIG. 5A, FIG. 5B and FIG. 5C, a substrate 58 is provided in FIG. 5A, a plurality of cavities, e.g., C1 and C2, are formed in the substrate 58 in FIG. 5B, and an adhesive tape 59 is attached to a bottom surface of the substrate 58 in FIG. 5C.

Figure 5D:
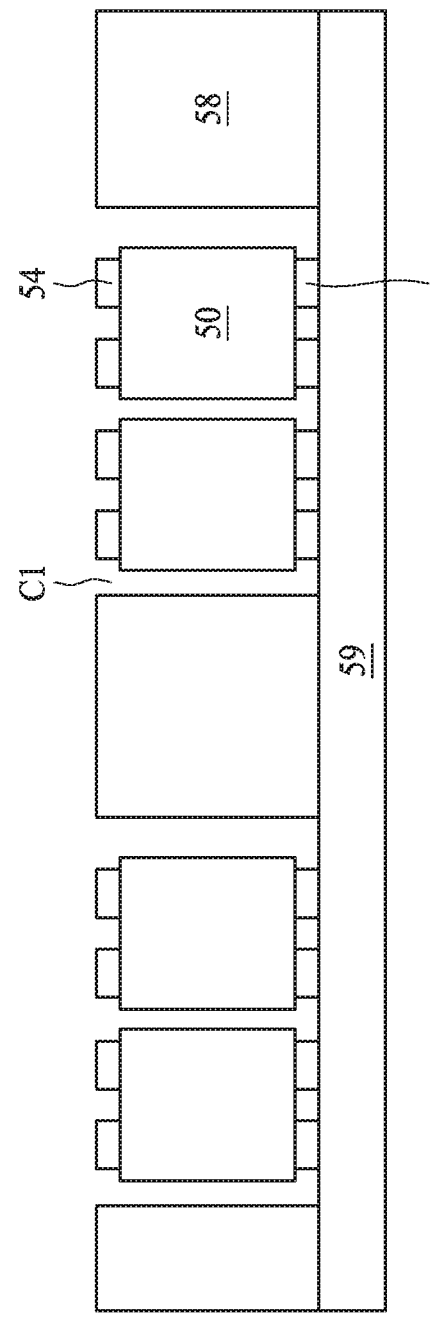

Referring to FIG. 5D, a plurality of electronic components 50 are divided into different groups and the electronic components 50 in each group are disposed in a respective one of the cavities and attached to the adhesive tape 59. The electronic components 50 may include an electrical contact pad 54 on a top surface of the electronic components 50 and/or an electrical contact pad 55 on a bottom surface of the electronic components 50. A bottom surface of the electrical contact pad 55 may be in contact with a top surface of the adhesive tape 59 or be buried into the adhesive tape 59. The electronic components may have difference shape or size and the number of the electronic components disposed in each cavity may be different.

Referring to FIG. 5E, an insulation material is applied, e.g., by lamination. The insulation material fills each of the cavities to encapsulate the electronic components 50 and forms a first insulation layer 51. The first insulation layer 51 may be made of a polymeric or a non-polymeric dielectric material as discussed above. In some embodiments, the first insulation layer 51 may fully cover electronic components 50 and the electrical contact pad 54 on a top surface of the electronic components 50. In some embodiments, the first insulation layer 51 may selectively cover a lower portion of the electronic components 50 and expose an upper portion of the electronic components 50 and the electrical contact pad 54 on a top surface of the electronic components 50.

Figure 5G:
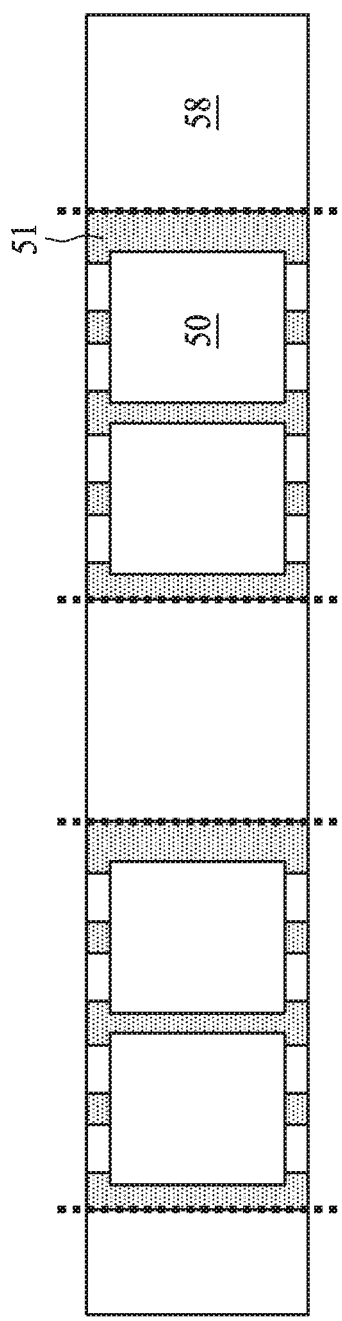
Figure 5I:
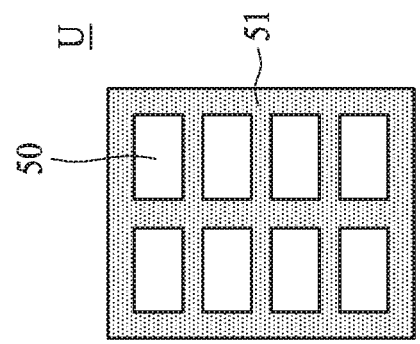
Figure 5H:
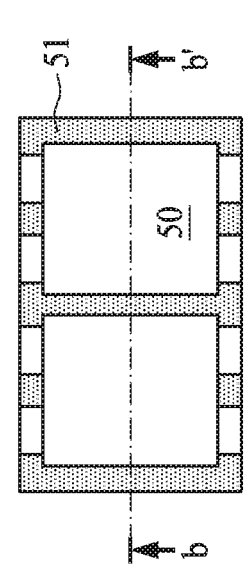

Referring to FIG. 5F, FIG. 5G and FIG. 5H, in FIG. 5F the adhesive tape 59 is removed after the formation of the first insulation layer 51, in FIG. 5G a singulation process is carried out, e.g., by cutting the first insulation layer 51 along a periphery of the cavities to form the component modules U as shown in FIG. 5H.

FIG. 5I is a cross-sectional view of the component module U taken along line b-b' of FIG. 5H. As shown in FIG. 5H, the resulting component module U includes the electronic component(s) 50 and a first insulation layer 51 encapsulating the electronic component(s) 50. The details of the component module and the electronic components are as discussed above.

In some embodiments, for example, when the first insulation layer 51 fully covers electronic components 50 and the electrical contact pad 54 on a top surface of the electronic components 50, an additional operation may be carried out to expose the electrical contact pad 54 on a top surface of the electronic components 50 from the first insulation layer 51. The additional operation may be, for example, but is not limited to, grinding.

In other embodiments, another method for manufacturing a component module may be used. The steps involved in this method are similar to those illustrated in FIG. 5D, FIG. 5E, FIG. 5F, FIG. 5G, FIG. 5H and FIG. 5I except that the electronic components 50 are directly attached to the adhesive tape 59 according to the layout of the corresponding component modules without the use of a substrate 58 to define cavities. In this method, the adhesive tape 59 is used as a carrier; a top surface of the carrier is divided into a plurality of surface regions; one or more electronic components are disposed in each of the surface regions according to the layout of the corresponding component modules; a first insulation layer is applied to encapsulate the electronic components; and after the removal of the carrier the first insulation layer is cut along a periphery of the surface regions to form the component modules.

FIG. 6A, FIG. 6B, FIG. 6C, FIG. 6D and FIG. 6E illustrate various stages of a method for manufacturing a semiconductor substrate in accordance with some embodiments of the present disclosure.

Figure 6A:
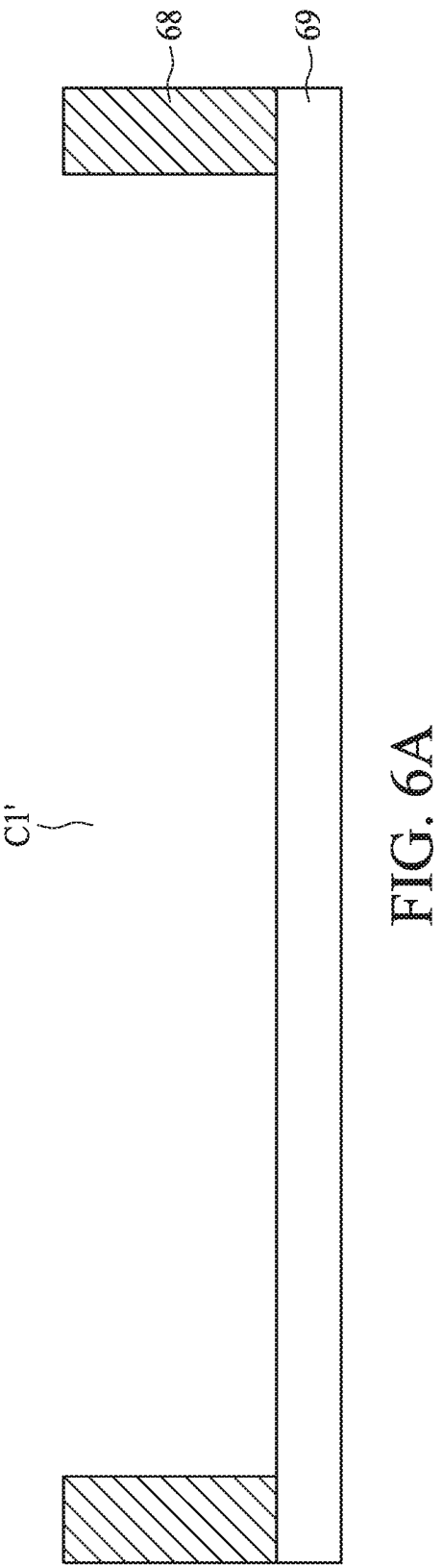
FIG. 6A, FIG. 6B, FIG. 6C, FIG. 6D and FIG. 6E illustrate various stages of a method for manufacturing a semiconductor substrate in accordance with some embodiments of the present disclosure.

Referring to FIG. 6A, a substrate 68 having one or more cavities, e.g., C1', is attached to an adhesive tape 69. In some embodiments, the substrate 68 may contain a conductive metal layer (not shown in FIG. 6A) disposed on a top surface and/or a bottom surface of the substrate 68. The conductive metal layer may be used to form conductive trace(s), pad(s), etc. for electrical connection.

Figure 6B:
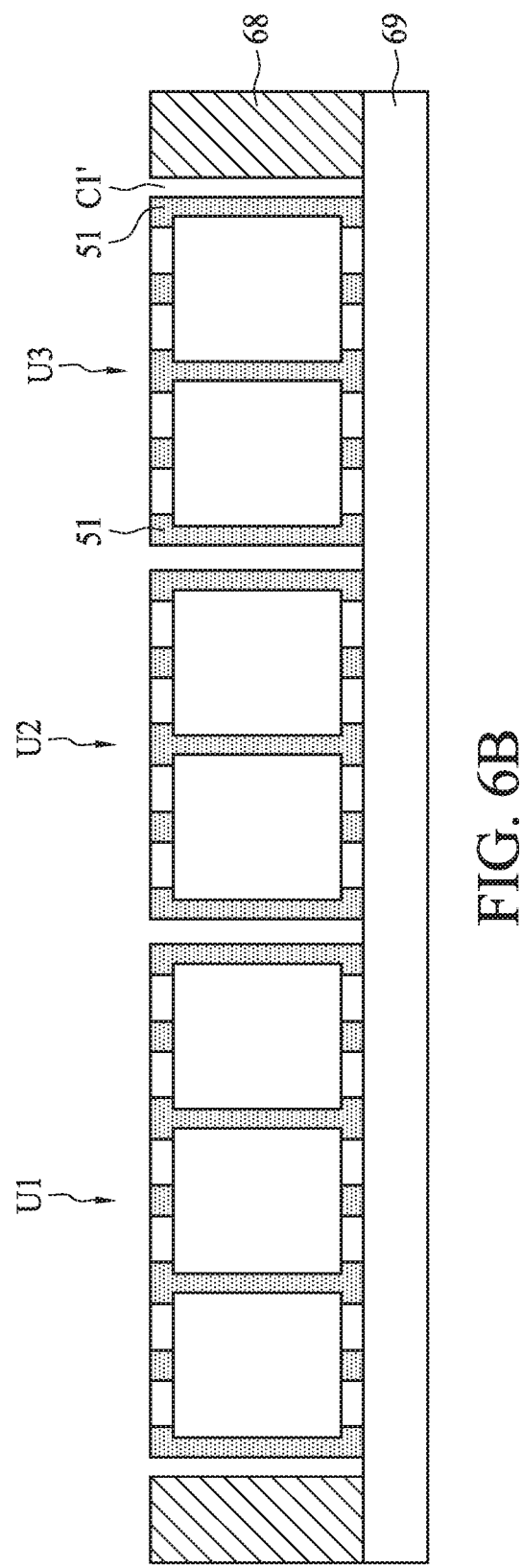

Referring to FIG. 6B, the component modules U1, U2 and U3 are disposed in the cavity C1' and attached to the adhesive tape 69. The component modules U1, U2 and U3 may be made, for example, by the method illustrated in FIG. 5A, FIG. 5B, FIG. 5C, FIG. 5D, FIG. 5E, FIG. 5F, FIG. 5G, FIG. 5H and FIG. 5I.

Figure 6C:
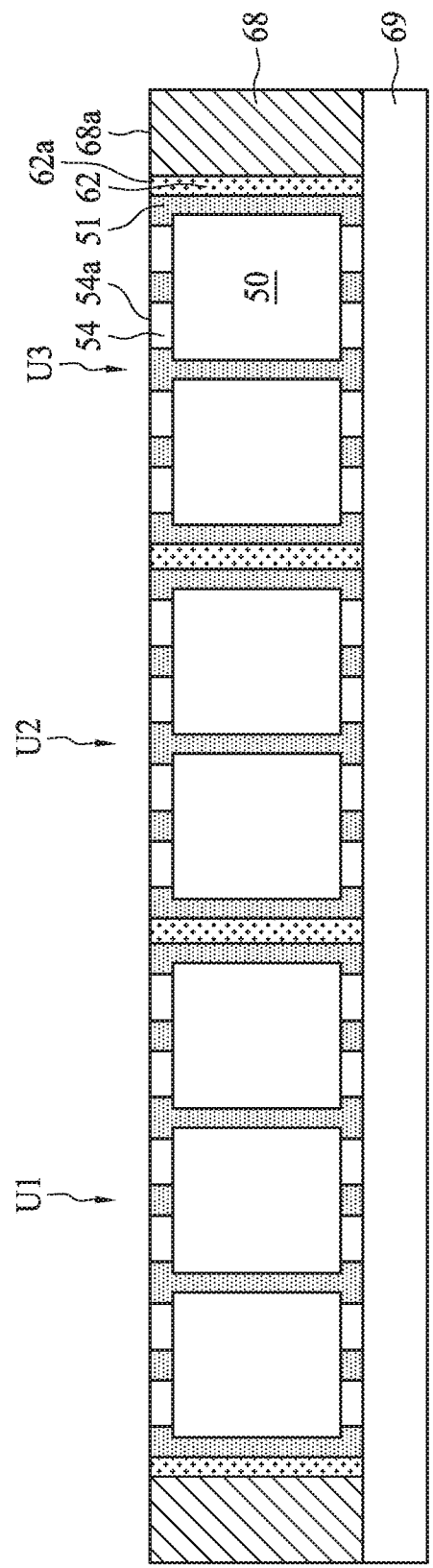

Referring to FIG. 6C, an insulation material is applied, e.g., by lamination. The insulation material fills the cavity C1' to encapsulate the component modules U1, U2 and U3 and forms a second insulation layer 62. The second insulation layer 62 may be made of a polymeric or a non-polymeric dielectric material as discussed above. The second insulation layer 62 and the first insulation layer 51 may be made of the same material or different materials. In some embodiments, a top surface 62a of the second insulation layer 62 may be coplanar with a top surface 68a of the substrate 68 and expose a top surface 54a of the electrical contact pad 54 of the electronic components 50. In some embodiments, the second insulation layer 62 may fully cover electronic components 50, the electrical contact pad 54 of the electronic components 50 and the first insulation layer 51, an additional operation (e.g., grinding) may be carried out to expose the electrical contact pad 54.

Figure 6D:
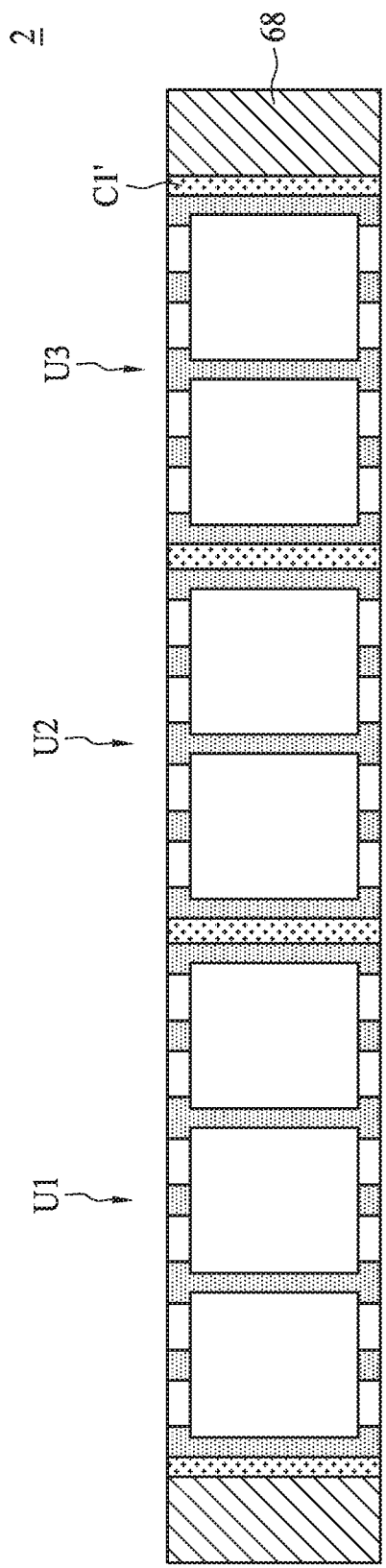

In FIG. 6D, the adhesive tape 69 is removed and a semiconductor substrate 2 is produced.

Figure 6E:
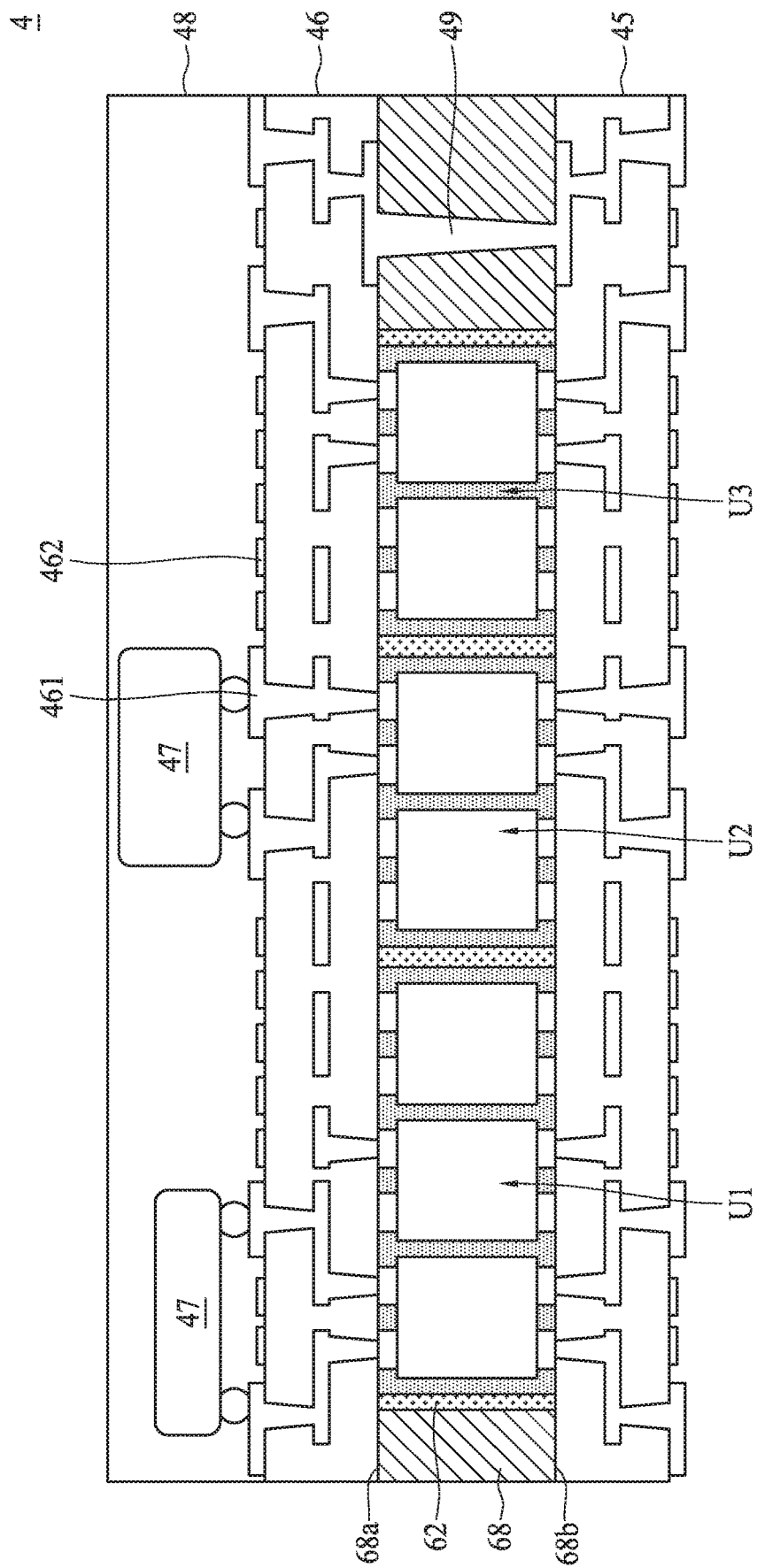

Referring to FIG. 6E, a conductive member 49 penetrating through the substrate 68 is formed, for example, by laser drilling, mechanical drilling or other suitable techniques together with electroplating or electroless plating. A first RDL structure 46 may be formed on a top surface 68a of the substrate 68 and a second RDL structure 45 may be formed on a bottom surface 68b of the substrate 68. The first RDL structure 46 and/or the second RDL structure 45 may be electrically connected to the conductive member 49. The second electronic components 47 are disposed on the first RDL structure 46, the encapsulant 48 is applied to encapsulate the first RDL structure 46 and the second electronic components 47, and a semiconductor package 4 is produced.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only and that practical implementations of the structures described herein can be spatially arranged in any orientation or manner, provided that the merits of embodiments of this disclosure are not deviated from by such an arrangement.

As used herein, the term "vertical" is used to refer to these upward and downward directions, whereas the term "horizontal" refers to directions transverse to the vertical directions.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between the highest point and the lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit, and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor substrate, comprising:
   lateral sides arranged along a plane; and
   a plurality of electronic components;
   wherein a total number of the electronic components is N, the electronic components are divided into M groups, M and N are positive integers, and M is smaller than N,
   wherein the electronic components in each group are surrounded by sides of a first insulation layer to form a respective one of component modules, wherein each of the sides of the first insulating layer directly contacts the respective one of the electronic components with no layer therebetween; and
   wherein each of the component modules is between two of the lateral sides, and a second insulation layer and surrounds the component modules, a first side of the second insulating layer directly contacts the first insulating layer with no layer therebetween, and a second side of the second insulating layer directly contacts one of the lateral sides with no layer therebetween.

2. The semiconductor substrate of claim 1, wherein the electronic components comprise a passive component, active component or both.

3. The semiconductor substrate of claim 1, wherein one or more of the electronic components comprise an electrical contact pad on a top surface of the electronic components and an electrical contact pad on a bottom surface of the electronic components.

4. The semiconductor substrate of claim 3, wherein the electrical contact pad on the top surface of the electronic components are exposed from the first insulation layer or the second insulation layer.

5. The semiconductor substrate of claim 3, wherein the electrical contact pad on the bottom surface of the electronic components are exposed from the first insulation layer or the second insulation layer.

6. The semiconductor substrate of claim 1, wherein N≥20.

7. The semiconductor substrate of claim 1, wherein 5≤M≤10.

8. The semiconductor substrate of claim 1, wherein a top surface of the first insulation layer is at a first height, a top surface of the second insulation layer is at a second height, and the first height is substantially the same as or lower than the second height.

9. The semiconductor substrate of claim 1, wherein the first insulation layer is made of a different material from which the second insulation layer are made.

10. The semiconductor substrate of claim 1, wherein the electronic components comprise a capacitor, a resistor or an inductor.

11. The semiconductor substrate of claim 1, wherein the electronic components in a same component module have the same or similar electrical characteristics.

12. A semiconductor package, comprising:

lateral sides arranged along a plane;

a first RDL structure disposed on a top surface of the lateral sides;

a plurality of component modules disposed between two of the lateral sides, wherein a plurality of first electronic components are distributed in the component modules, each of the component modules comprises a first insulation layer comprising sides that surround the first electronic components distributed therein, wherein each of the sides of the first insulating layer directly contacts the respective one of the first electronic components with no layer therebetween, and wherein a total number of the first electronic components is N, a total number of the component modules is M, M and N are positive integers, and M is smaller than N;

a second insulation layer comprising walls that surround the component modules, wherein a first side of the second insulating layer directly contacts the first insulating layer with no layer therebetween, and a second side of the second insulating layer directly contacts one of the lateral sides with no layer therebetween; and a second electronic component disposed on a top surface of the first RDL structure.

13. The semiconductor package of claim 12, further comprising an encapsulant covering the top surface of the first RDL structure and the second electronic component.

14. The semiconductor package of claim 12, further comprising a second RDL structure disposed on a bottom surface of the lateral sides.

15. The semiconductor package of claim 12, wherein the first electronic components comprise a passive component, active component or both.

\* \* \* \* \*